United States Patent
He et al.

(10) Patent No.: US 9,673,411 B2
(45) Date of Patent: Jun. 6, 2017

(54) ORGANIC ELECTROLUMINESCENT DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Quanhua He, Beijing (CN); Hao Zhang, Beijing (CN); Lingyun Shi, Beijing (CN); Xiaobo Xie, Beijing (CN); Xiurong Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/099,536

(22) Filed: Apr. 14, 2016

(65) Prior Publication Data
US 2017/0092886 A1 Mar. 30, 2017

(30) Foreign Application Priority Data
Sep. 24, 2015 (CN) .......................... 2015 1 0617965

(51) Int. Cl.
*H01L 29/08* (2006.01)
*H01L 51/50* (2006.01)
*H01L 27/32* (2006.01)

(52) U.S. Cl.
CPC ........ *H01L 51/502* (2013.01); *H01L 27/3265* (2013.01); *H01L 27/3276* (2013.01); *H01L 51/5056* (2013.01); *H01L 51/5072* (2013.01)

(58) Field of Classification Search
CPC .. H01L 33/0004–33/648; H01L 27/288; H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

| 2010/0213438 | A1* | 8/2010 | Cho | ................. | B82Y 20/00 257/13 |
| 2013/0043803 | A1* | 2/2013 | Raj | ................. | H05B 33/0896 315/241 R |

FOREIGN PATENT DOCUMENTS

CN 104766878 A 7/2015

* cited by examiner

*Primary Examiner* — Cuong B Nguyen
(74) *Attorney, Agent, or Firm* — Blakely Sokoloff Taylor & Zafman LLP

(57) ABSTRACT

The present invention relates to the technical field of display devices, and discloses an organic electroluminescent display device. The display device comprises a cathode, a Q+ quantum dot layer, a light emitting layer, a Q− quantum dot layer, and an anode stacked together. The display device further comprises a capacitor, two electrode plates of which are connected with the Q+ quantum dot layer and the Q− quantum dot layer respectively, wherein the Q+ quantum dot layer and the Q− quantum dot layer are used for emitting light waves having the same wavelength as those of the light emitting layer, and wherein the capacitor charges when a control device for controlling the light emission of the light emitting layer is switched on and starts to discharge when the control device is switched off.

11 Claims, 1 Drawing Sheet

ORGANIC ELECTROLUMINESCENT DISPLAY DEVICE

RELATED APPLICATIONS

The present application claims the benefit of Chinese Patent Application No. 201510617965.X, filed on Sep. 24, 2015, the entire disclosure of which is incorporated herein by reference.

FIELD

The present invention relates to the technical field of display devices, and in particular relates to an organic electroluminescent display device.

BACKGROUND ART

Organic electroluminescent display devices usually adopt a light emitting layer disposed between electron/hole emission layers, and emit light by means of the light emitting layer. However, the organic electroluminescent display devices in the prior art have a very low luminous efficiency.

SUMMARY

The present invention provides an organic electroluminescent display device for improving the luminous efficiency of the organic electroluminescent display device.

The present invention provides an organic electroluminescent display device. The display device comprises: a cathode, an anode, as well as a Q+ quantum dot layer, a light emitting layer and a Q− quantum dot layer disposed between the cathode and the anode and stacked in a direction from the cathode to the anode. The display device further comprises a capacitor, two electrode plates of which are connected with the Q+ quantum dot layer and the Q− quantum dot layer respectively, wherein the Q+ quantum dot layer and the Q− quantum dot layer are used for emitting light waves having the same wavelength as those of the light emitting layer, and wherein the capacitor charges when a control device for controlling the light emission of the light emitting layer is switched on and starts to discharge when the control device is switched off.

In the above solution, on the one hand, by adding a Q+ quantum dot layer and a Q− quantum dot layer on respective sides of the light emitting layer and enabling the two quantum dot layers to emit light waves having the same wavelength as those of the light emitting layer, the luminous efficiency of the organic electroluminescent display device is greatly increased when the control device is switched on. On the other hand, since the capacitor charges when the cathode and the anode are powered up, with the Q+ quantum dot layer and the Q− quantum dot layer, more charging charges can be provided to the capacitor such that the capacitor accumulates more charges during charging. Accordingly, even if the control device is switched off, the light emitting layer of the display device can still maintain a relatively stable voltage under the influence of the capacitor and further continue emitting light. In light of the above facts, the solution according to the present invention effectively increases the luminous efficiency of the organic electroluminescent display device and thereby improves the display effect of the organic electroluminescent display.

Furthermore, the organic electroluminescent display device further comprises an electron transport layer disposed between the Q+ quantum dot layer and the cathode, as well as a hole transport layer disposed between the Q− quantum dot layer and the anode.

Furthermore, the Q+ quantum dot layer is a quantum dot layer carrying positive charges, and in the Q+ quantum dot layer, vias connecting the electron transport layer and the light emitting layer are provided.

Furthermore, the Q− quantum dot layer is a quantum dot layer carrying negative charges, and in the Q− quantum dot layer, vias connecting the hole transport layer and the light emitting layer are provided.

Furthermore, the Q+ quantum dot layer and the Q− quantum dot layer have the same molecular size and energy level structure as those of the light emitting layer.

Furthermore, the light emitting layer comprises a plurality of pixel regions, and there is a one-to-one correspondence between the pixel regions and the vias in the Q+ quantum dot layer and the Q− quantum dot layer.

Furthermore, the pixel regions comprise three subpixel regions, namely a red subpixel region, a blue subpixel region and a green subpixel region.

Furthermore, one electrode plate of the capacitor is connected with the Q+ quantum dot layer via the electron transport layer, and the other electrode plate is connected with the Q− quantum dot layer via the hole transport layer.

REFERENCE NUMBERS

1—cathode; 2—electron transport layer; 3—light emitting layer; 4—hole transport layer; 5—anode; 6—Q+ quantum dot layer; 7—Q− quantum dot layer; 8—via; 9—quantum dot molecule; 10—organic/inorganic solute.

DETAILED DESCRIPTION OF EMBODIMENTS

In order to improve the luminous efficiency of organic electroluminescent display devices, the embodiments of the present invention provide an organic electroluminescent display device. In the technical solution of the present invention, by using a Q+ quantum dot layer and a Q− quantum dot layer that can emit light waves having the same wavelength as those of the light emitting layer, as well as a capacitor that charges when a control device is switched on and starts to discharge when the control device is switched off, the luminous efficiency of the organic electroluminescent display device is greatly increased and the display effect of the organic electroluminescent display device is thereby improved. In order to facilitate understanding the technical solution of the present invention, the technical solution of the present invention shall be explained in details as follows with reference to drawings and specific embodiments.

Figure 1:
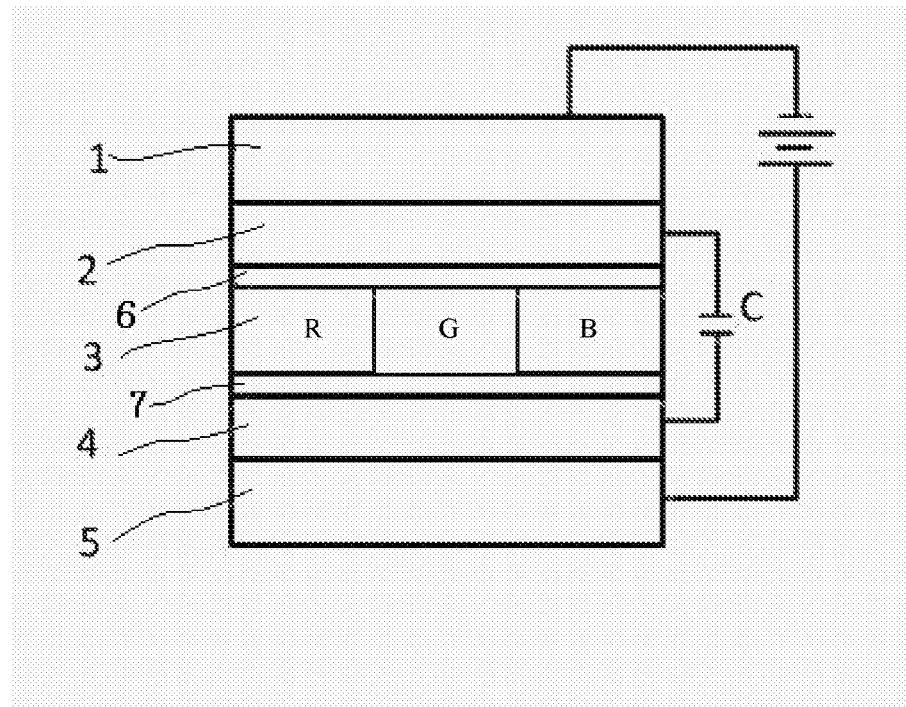
FIG. 1 is a schematic structural view of an organic electroluminescent display device provided by the embodiments of the present invention.

With reference to FIG. 1, which is a block diagram showing the structure of an organic electroluminescent display device provided by the embodiments of the present invention.

The embodiments of the present invention provide an organic electroluminescent display device. The display device comprises: a cathode 1, an anode 5, as well as a Q+ quantum dot layer 6, a light emitting layer 3 and a Q− quantum dot layer 7 disposed between the cathode 1 and the anode 5 and stacked in a direction from the cathode 1 to the anode 5. The display device further comprises a capacitor C, two electrode plates of which are connected with the Q+ quantum dot layer 6 and the Q− quantum dot layer 7 respectively, wherein the Q+ quantum dot layer 6 and the Q− quantum dot layer 7 are used for emitting light waves having the same wavelength as those of the light emitting layer 3, and wherein the capacitor C charges when a control device (not shown) for controlling the light emission of the light emitting layer 3 is switched on and starts to discharge when the control device is switched off.

In the above embodiments, on the one hand, by adding the Q+ quantum dot layer 6 and the Q− quantum dot layer 7 on respective sides of the light emitting layer 3 and enabling the two quantum dot layers 6, 7 to emit light waves having the same wavelength as those of the light emitting layer 3, the luminous efficiency of the organic electroluminescent display device is greatly increased when the control device is switched on. On the other hand, since the capacitor C charges when the cathode 1 and the anode 5 are powered up, with the Q+ quantum dot layer 6 and the Q− quantum dot layer 7, more charging charges can be provided to the capacitor C such that the capacitor C accumulates more charges during charging. Accordingly, even if the control device is switched off, the light emitting layer 3 of the display device can still maintain a relatively stable voltage under the influence of the capacitor C and further continue emitting light. In light of the above facts, the above embodiments according to the present invention effectively increase the luminous efficiency of the organic electroluminescent display device and thereby improve the display effect of the organic electroluminescent display device.

In order to facilitate understanding the organic electroluminescent display device provided by the embodiments of the present invention, the structure and the operation principle thereof shall be described in details as follows in combination with the specific embodiments.

With continued reference to FIG. 1, the organic electroluminescent display device provided by the embodiments comprises: a cathode 1, an anode 5, a light emitting layer 3 disposed between the cathode 1 and the anode 5, a Q+ quantum dot layer 6 disposed between the cathode 1 and the light emitting layer 3, as well as a Q− quantum dot layer 7 disposed between the anode 5 and the light emitting layer 3.

In specific embodiments, the organic electroluminescent display device provided by the embodiments further comprises an electron transport layer 2 disposed between the Q+ quantum dot layer 6 and the cathode 1, as well as a hole transport layer 4 disposed between the Q− quantum dot layer 7 and the anode 5.

Figure 2:
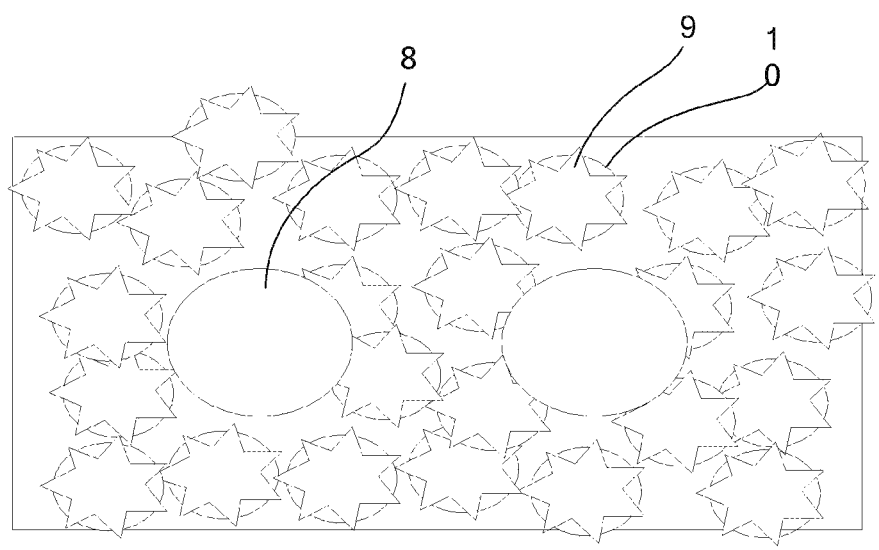
FIG. 2 is a schematic structural view of a quantum dot layer provided by the embodiments of the present invention.

Specifically, the Q+ quantum dot layer 6 provided by the above embodiments is a quantum dot layer carrying positive charges, and in the Q+ quantum dot layer 6, vias 8 connecting the electron transport layer 2 and the light emitting layer are provided. Besides, the Q− quantum dot layer 7 is a quantum dot layer carrying negative charges, and in the Q− quantum dot layer 7, vias 8 connecting the hole transport layer 4 and the light emitting layer are provided. Specifically, the Q+ quantum dot layer 6 and the Q− quantum dot layer 7 have the same structure, wherein the only difference lies in that the Q+ quantum dot layer 6 carries positive charges while the Q− quantum dot layer 7 carries negative charges. As shown in FIG. 2, specifically, the quantum dot layers 6, 7 comprise quantum dot molecules 9 and an organic/inorganic solute 10 wrapping the quantum dot molecules 9. Besides, the Q+ quantum dot layer 6 and the Q− quantum dot layer 7 comprise vias 8 respectively, wherein the vias 8 in the Q+ quantum dot layer 6 connect the light emitting layer 3 with the electron transport layer 2, and the vias 8 in the Q− quantum dot layer 7 connect the light transmission layer 3 with the hole transport layer 4. Accordingly, when the cathode 1 and the anode 5 are powered up, charges can be transported over the vias 8.

Furthermore, the Q+ quantum dot layer 6 and the Q− quantum dot layer 7 have the same molecular size and energy level structure as those of the light emitting layer 3. Specifically, the light emitting layer 3 comprises a plurality of pixel regions, and there is a one-to-one correspondence between the pixel regions and the vias 8 in the Q+ quantum dot layer 6 and the Q− quantum dot layer 7. As shown in FIG. 1, the light emitting layer 3 is divided into a plurality of pixel regions, wherein each pixel region comprises three subpixel regions, namely a red subpixel region, a blue subpixel region and a green subpixel region. More specifically, in positions corresponding to RGB subpixels, the molecule structure and the energy level of the quantum dot layers are the same as those of the light emitting layer 3. Thus, when the cathode 1 and the anode 5 are powered up, the capacitor C starts to charge, and the Q+ quantum dot layer 6 and the Q− quantum dot layer 7 also emit light waves with corresponding wavelengths, which greatly increases the luminous efficiency of the display device. On the other hand, when the control device is switched off, the pixels maintains a fixed voltage value under the influence of the capacitor C and continues emitting light until the next frame refresh moment. In this case, the Q+ quantum dot layer 6 and the Q− quantum dot layer 7 can emit light of RGB colors corresponding to the light emitting layer 3. Therefore, the luminous efficiency of the organic electroluminescent display device is increased and the display effect of the organic electroluminescent display device is thereby improved.

In specific embodiments, one electrode plate of the capacitor C is connected with the Q+ quantum dot layer 6 via the electron transport layer 2, and the other electrode plate is connected with the Q− quantum dot layer 7 via the hole transport layer 3. Specifically, the capacitor C is etched between the electron transport layer 2 and the hole transport layer 4. When the control device is switched on, the capacitor C charges, and the Q+ quantum dot layer 6 and the Q− quantum dot layer 7 can also emit light waves with corresponding wavelengths, which greatly increases the luminous efficiency of the display device. On the other hand, when the control device is switched off, the pixels maintains a fixed voltage value under the influence of the capacitor C and continues emitting light until the next frame refresh moment.

Apparently, the skilled person in the art can modify and transform the present invention at will without deviating from the spirit and the scope of the present invention. If the modifications and the transformations of the present invention fall within the scope of the claims of the present invention and the equivalent techniques thereof, they are also intended to be included in the present invention.

The invention claimed is:

1. An organic electroluminescent display device comprising: a cathode, an anode, as well as a Q+ quantum dot layer, a light emitting layer and a Q− quantum dot layer disposed between the cathode and the anode and stacked in a direction from the cathode to the anode;

the organic electroluminescent display device further comprising a capacitor, two electrode plates of which are connected with the Q+ quantum dot layer and the Q− quantum dot layer respectively, wherein the Q+ quantum dot layer and the Q− quantum dot layer are used for emitting light waves having the same wavelength as those of the light emitting layer, and wherein the capacitor charges when a control device for controlling the light emission of the light emitting layer is switched on and starts to discharge when the control device is switched off;

the organic electroluminescent display device further comprising an electron transport layer disposed between the Q+ quantum dot layer and the cathode, as well as a hole transport layer disposed between the Q− quantum dot layer and the anode, wherein the Q+ quantum dot layer is a quantum dot layer carrying positive charges, and in the Q+ quantum dot layer, vias connecting the electron transport layer and the light emitting layer are provided.

2. The organic electroluminescent display device according to claim 1, wherein the Q− quantum dot layer is a quantum dot layer carrying negative charges, and in the Q− quantum dot layer, vias connecting the hole transport layer and the light emitting layer are provided.

3. The organic electroluminescent display device according to claim 2, wherein the Q+ quantum dot layer and the Q− quantum dot layer have the same molecular size and energy level structure as those of the light emitting layer.

4. The organic electroluminescent display device according to claim 2, wherein the light emitting layer comprises a plurality of pixel regions, and there is a one-to-one correspondence between the pixel regions and the vias in the Q+ quantum dot layer and the Q− quantum dot layer.

5. The organic electroluminescent display device according to claim 4, wherein the pixel regions comprise three subpixel regions, namely a red subpixel region, a blue subpixel region and a green subpixel region.

6. The organic electroluminescent display device according to claim 1, wherein one electrode plate of the capacitor is connected with the Q+ quantum dot layer via the electron transport layer, and the other electrode plate is connected with the Q− quantum dot layer via the hole transport layer.

7. The organic electroluminescent display device according to claim 1, wherein one electrode plate of the capacitor is connected with the Q+ quantum dot layer via the electron transport layer, and the other electrode plate is connected with the Q− quantum dot layer via the hole transport layer.

8. The organic electroluminescent display device according to claim 2, wherein one electrode plate of the capacitor is connected with the Q+ quantum dot layer via the electron transport layer, and the other electrode plate is connected with the Q− quantum dot layer via the hole transport layer.

9. The organic electroluminescent display device according to claim 3, wherein one electrode plate of the capacitor is connected with the Q+ quantum dot layer via the electron transport layer, and the other electrode plate is connected with the Q− quantum dot layer via the hole transport layer.

10. The organic electroluminescent display device according to claim 4, wherein one electrode plate of the capacitor is connected with the Q+ quantum dot layer via the electron transport layer, and the other electrode plate is connected with the Q− quantum dot layer via the hole transport layer.

11. The organic electroluminescent display device according to claim 5, wherein one electrode plate of the capacitor is connected with the Q+ quantum dot layer via the electron transport layer, and the other electrode plate is connected with the Q− quantum dot layer via the hole transport layer.

* * * * *